IMPROVED TRANSISTORIZED MIXING CIRCUIT
Filed Jan. 28, 1959
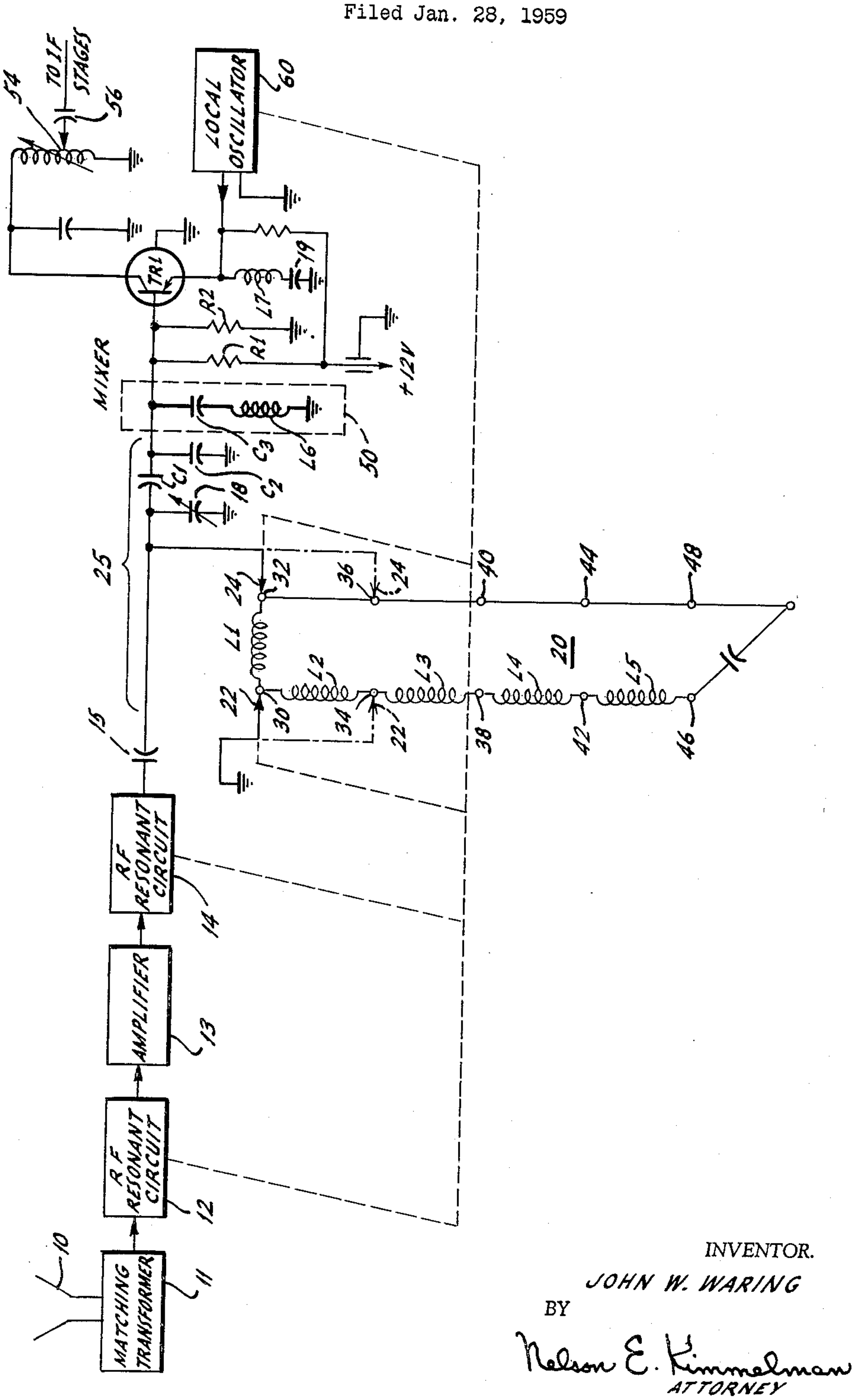
INVENTOR.
JOHN W. WARING
BY
Nelson E. Kimmelman
ATTORNEY 2,978,578
Patented Apr. 4, 1961

2,978,578

IMPROVED TRANSISTORIZED MIXING CIRCUIT

John W. Waring, Palmyra, N.J., assignor to Philco Corporation, Philadelphia, Pa., a corporation of Pennsylvania Filed Jan. 28, 1959, Ser. No. 789,552

9 Claims. (Cl. 250—20)

This invention relates to mixing circuits and in particular to transistorized mixing circuits for use in television receivers.

One characteristic of a transistor is that its input impedance is low compared with its output impedance. This characteristic is unlike that of the usual vacuum tube and must be reckoned with in designing circuits for transistors. It has been customary in the design of transistorized tuners for television receivers to supply the received RF wave to the mixer transistor from a resonate circuit. For tuning different stations, different inductances are switched into the resonant circuit to change the resonant frequency to the frequency of the carrier transmitted by the desired television station. It would, of course, be possible to so take off the RF signal from each of these coils as to present a relatively low impedance to the input of the transistor by providing each inductance with a step-down tap. However, this would make such tuners expensive and would multiply the problems of switching.

In order to avoid the expense and difficulties inherent in attempting to switch tapped inductances, it has been proposed heretofore to employ untapped inductances together with capacitive step-down transformers to provide a low impedance (at the RF frequency) input to the mixer transistor. However, while capacitors perform the impedance step-down function satisfactorily with respect to the RF input signal, they present a very high capacitive reactance to the much lower intermediate frequency. As a result, the input impedance to the mixer at the IF is raised considerably and the mixer is not able to perform as efficiently as it does when low-impedance tapped inductances only primarily constitute the mixer transistor's input impedance to IF.

Accordingly, a primary object of the present invention is to provide a novel mixer circuit having excellent gain characteristics.

Another object of the invention is to provide a novel transistorized mixer circuit having a capacitively stepped-down input circuit but much greater mixer gain at the intermediate frequency than has hitherto been attained.

Still another object of the invention is to provide a high-gain transistorized mixer circuit which reduces the need for additional intermediate frequency traps.

Another object of the invention is to provide a simpler and less expensive tuner for television receiving sets.

Yet another object of the invention is to provide a transistorized mixer circuit in which the need for neutralization is considerably reduced.

Another object of the invention is to prevent mistuning of the tuned circuit in a transistorized mixer output circuit in response to changes in the reactances of the tuned circuit in the mixer input.

Another object of the invention is to provide a mixer circuit for use in transistorized apparatus which does not require relatively expensive transistors to achieve high-gain at the intermediate frequency.

In accordance with my invention I provide, in a transistorized mixer circuit whose input circuit impedance at the intermediate frequency is unduly high, means for reducing the input impedance at that frequency. I provide, in the input circuit to the transistor, a resonant circuit which presents a negligible impedance path to the intermediate frequency components in the input circuit thereby enabling increased amounts of said components to flow in said input circuit. Since a transistor is essentially a current responsive device whose output is a function of the current flowing through the input circuit, the output current of the mixer at the intermediate frequency is maximized resulting in much greater gain than was formerly attainable in such circuits.

The sole figure is a block and schematic diagram of a typical television receiving set "front-end" which incorporates my invention.

The figure shows a typical environment in which my invention may be used and includes components of a typical television receiver up to the intermediate-frequency stages. A conventional antenna 10 conducts the received signal to a matching transformer 11 which may be of conventional "balun" construction. The secondary of the matching transformer 11 couples the incoming signal to a tank circuit 12 which is made to resonate (together with circuits 14 and 25 as will be explained hereinafter) at the frequency of the desired incoming RF signal. The output of the resonant circuit 12 is applied to a conventional transistor amplifier 13 whose output circuit is connected to another tank circuit 14 which is made to resonate at (or near) the same frequency as the resonant circuits 12 and 25 as explained above. These resonant circuits can be made conjunctively to produce, if desired, a broad passband if their respective passbands are somewhat different. The RF signal from the circuit 14 is coupled via condenser 15 from the high end of that circuit to the high end of another tank circuit 25 comprising the variable capacitor 18, C1 and C2, and selected ones of the inductances in the circuit 20. As the operator of the receiver turns the station selector, the contact arms 22 and 24 are switched in unison, as indicated by the dashed lines, with the adjustment of the tuning elements in the resonant circuits 12 and 14. As shown the arms 22 and 24 contact the terminals 30 and 32 so that the inductance L1 and the condenser 18 are in shunt when channel 6 is tuned in. Since the parallel circuit formed by inductance L1 and the capacitance in shunt therewith is resonant substantially at the frequency of channel 6, it will present a relatively high impedance to signals at this frequency. To tune in channel 5, for example, the arms 22 and 24 would be switched into contact with the terminals 34 and 36 thereby to include the series combination of L1 and L2 in the tank circuit 25. This again makes the parallel circuit resonant at the desired input frequency so that a high impedance is presented to the signals corresponding to channel 5. Terminals 38—40, 42—44, and 46—48 are provided for the tuning of channels 4, 3 and 2 respectively. Another set of inductances (not shown) similar to circuit 20 is also provided for tuning the higher frequency stations (channels 7 through 13). Resistances R1 and R2 act as a voltage divider for biasing the base of TR1.

A conventional local oscillator 60 supplies its signal to the input emitter-base circuit of TR1. Inductance L7, which has negligible impedance at the intermediate frequency, is provided to constitute an impedance at the oscillator frequency that will permit the oscillator input to TR1 to be of the proper magnitude. Capacitor 19, which has a negligible impedance at the intermediate frequency, is in series with L7. The frequency of the signal from oscillator 60 is varied, as is conventional in superheterodyne receiver practice, by virtue of a tuning element in the oscillator being controlled in unison with similar elements in circuits 12, 14 and 20 as explained above, thereby to maintain a constant IF signal in the output of the mixer TR1 which may be a Philco type 2N502 transistor, for example.

The tank circuit 25 includes selected ones of the inductances of circuit 20 in parallel with capacitor 18, the series capacitors C1 and C2, and such distributed shunt capacitance as may be present. Since capacitors C1 and C2 constitute a capacitance divider across the tank circuit 25, enabling the base of TR1 to be driven from a tapped-down point on the tank circuit 25, the tank effectively presents a low impedance to the base input circuit of transistor TR1 at the selected RF carrier frequency. However, these same capacitors, at the intermediate frequency, constitute a much larger impedance, thereby greatly limiting the flow of intermediate frequency currents in the input circuit of TR1 with a consequent reduction in its gain.

There is therefore provided, according to my invention, a series resonant circuit as shown within the rectangle 50 between the base and ground which resonates substantially at the intermediate frequency. The addition of this series circuit, which comprises the condenser C3 and the inductance L6, provides a very impedance path for the flow of intermediate frequency currents in the emitter-base circuit of TR1. (Alternatively the trap 50 may be connected directly to the emitter, if desired, instead of to ground.) Consequently, there will appear in the output emitter-collector circuit of TR1 an intermediate frequency signal which exhibits an increase in gain on the order of 6 db (or higher) over that of a similar circuit minus the series resonant circuit. The intermediate frequency output signal is taken off at the desired point on the inductance 54 via the condenser 56 and applied to subsequent IF stages (not shown).

To summarize, the series resonant trap (C3, L6) from the base of TR1 to ground provides an effective short circuit at substantially the intermediate frequency so that all of the latter components generated in the base-emitter diode section of TR1 will cause base currents to flow thereby producing correspondingly amplified currents in the output circuit of TR1. Without the trap 50, the base-emitter diode is substantially open so mixing action must take place in the collector circuit with an associated loss of efficiency. This is true in transistors presently in use because their efficiency is considerably greater at intermediate frequencies than it is at radio frequencies.

While the invention has been shown in conjunction with a mixer input circuit comprising a tank circuit shunted by a purely capacitive step-down circuit, its use is not limited thereto. Addition of a series circuit resonant to signals at the intermediate frequency in the input circuit of a transistor mixer will be of value also whenever the input circuit otherwise would present a relatively high impedance to the intermediate frequency, as for example where there is an inductance coupling the tuned circuit to the input electrode of the mixer transistor. This inductance may constitute an appreciable impedance at IF and the addition of the series resonant circuit as taught above will increase the flow of the intermediate frequency components generated at the input junction, thereby increasing the gain of the transistor mixer.

The invention is also applicable in a transistor mixer input circuit in which the step-down circuit for the RF input signal comprises both capacitance and resistance which may be in series, for example. In this case also use of a resonant circuit in the input circuit for increasing the amplitude of the intermediate frequency current will also be of value.

Besides increasing the gain of the transistor mixer the use of this series resonant circuit has other advantages. Since it is effectively coupled from the input electrode to the common electrode, it also acts as a trap for any extraneous signals at the intermediate frequency and may obviate extra traps elsewhere.

Moreover, whereas other types of transistor mixer circuits often require neutralization between the output and the input circuits to prevent regeneration of the IF signal, the series circuit as shown in block 50 of the sole figure effectively constitutes a short (at IF) between the input and output circuits thereby making such neutralization unnecessary.

It has also been observed that the use of my novel circuit as taught herein also tends to prevent mistuning of the tuned circuit in the output of the transistor mixer due to changes in the reactance of the tank circuit as seen from the input to the transistor mixer.

Use of the invention also helps in avoiding resort to more expensive, premium-type transistors to achieve the requisite gain. This follows from the fact that the gain of a transistor falls off at about 6 db per octave at the high frequency end of its response characteristic. When the present invention is used with an average transistor, the enhancement of the intermediate frequency flow in the input circuit enables a relatively larger gain to be achieved than is customary so that effectively the high frequency response of that transistor in mixer operation may decrease, not at a 6 db per octave rate, but at a 3 db per octave rate. Without employing the invention, the upper frequency response of the same transistor may be inadequate for the intended purpose and so more expensive, premium transistors, having a higher response toward the high frequency end, may be required to achieve the same gain as the average transistor which employs the present invention.

In addition to the modifications and applications mentioned above, various other modifications and applications can be made without departing from the scope and spirit of my invention.

I claim:

1. A mixer circuit comprising: a resonant signal-input circuit having variable inductance means and shunt capacitance means, said capacitance means including a pair of series-connected capacitors connected in shunt with said variable inductance means, said resonant circuit presenting a very high impedance at signal frequency; a transistor having emitter, base, and collector electrodes; means coupling the low-potential terminal of said resonant circuit to said emitter electrode and means coupling the junction between said series-connected capacitors to said base electrode whereby the impedance presented by said resonant circuit to the base-emitter diode of said transistor at signal frequency is substantially lower than that presented across the entire resonant circuit; means for generating a local oscillation and means for injecting said local oscillation in the base-emitter diode circuit of said transistor, the application of said local oscillation to said emitter-base diode in conjunction with the applied signal resulting in the generation, in said base-emitter diode circuit of an intermediate frequency signal; inductive and capacitive means connected in series between the emitter and base terminals of said transistor and tuned substantially to series resonance at said intermediate frequency signal thereby to minimize the impedance of the external base-emitter circuit at said intermediate frequency and thereby to maximize the flow of currents of intermediate frequency in the base-emitter circuit of said transistor; and a tuned intermediate frequency output circuit coupled to the emitter and collector electrodes of said transistor.

2. A mixer circuit comprising: a semiconductive device having at least three electrodes, a circuit coupled to a first and a second of said electrodes wherein a first signal is produced, said last-mentioned circuit presenting a relatively high impedance to said device at frequencies near said first signal frequency, means coupled to said circuit and to said first and second electrodes for reducing said impedance at said first signal frequency, means coupled to said first and second electrodes for applying a second signal to said device which differs in frequency from said first signal, means coupled to said first and second electrodes for providing a relatively low impedance path for signals having a frequency substantially equal to the difference between the frequencies of said first and second signals, and an output circuit coupled to said second electrode and a third of said electrodes.

3. A mixer circuit comprising: a semiconductive device having at least three electrodes, a circuit resonant to a selected signal frequency, said resonant circuit including capacitive means coupled to a first and a second of said electrodes for reducing the impedance presented to said device by said resonant circuit at said selected signal frequency, means for applying a second signal having a frequency different from said selected signal frequency between said first and second electrodes, resonant means coupled to said first and second electrodes for providing a substantially negligible impedance path for signals having a frequency substantially equal to the difference between said selected signal frequency and said second signal frequency, and an output circuit coupled between said second and a third of said electrodes.

4. A mixer circuit comprising: a transistor device having at least three electrodes, a first circuit resonant to a first signal frequency, said first circuit including capacitive means coupled to said first and second electrodes for substantially reducing the impedance of said first circuit presented to said device at said first frequency, means for applying a second signal having a frequency different from said first frequency to said first and second electrodes, said capacitive means inherently presenting an impedance to said device at a frequency equal to the difference in frequencies of said first and second signals which is considerably larger than the said impedance presented thereto at said first frequency, a series-resonant circuit coupled to said first and second electrodes which presents a substantially negligible impedance to signals having a frequency substantially equal to said difference frequency, and an output circuit connected to said second electrode and to a third of said electrodes.

5. A mixer circuit comprising: a transistor device having at least three electrodes, a variable tuned circuit coupled to first and second electrodes of said device which includes capacitive impedance-transforming means for stepping-down the impedance presented by said tuned circuit to said device at selected frequencies to which said tuned circuit may be tuned, means for applying a second signal difference in frequency from said selected frequencies between said first and second electrodes, said impedance-transforming means being constructed to present a substantially greater impedance to said device at frequencies substantially equal to the difference between the frequencies of said selected frequencies and the frequency of said second signal than the said impedance presented to said device at said selected frequencies, a series resonant circuit coupled between said first and second electrodes resonant to signals having a frequency substantially equal to said difference frequencies, and an output circuit connected to said second electrode and a third of said electrodes.

6. A mixer circuit comprising: a transistor having at least three electrodes, a resonant circuit adjustable to resonate at selected signal frequencies which includes two condensers in series coupled to first and second electrodes of said device, said condensers constituting an impedance transformer for reducing the impedance presented by said resonant circuit to said first and second electrodes at said selected signal frequencies, means for applying a second signal having a frequency different from said selected frequencies between said first and second electrodes, said impedance-transforming means presenting substantially greater impedance to signals in the circuit between said first and second electrodes which have frequencies substantially equal to the difference between said selected signal frequencies and said second signal frequency than to signals therein at said selected signal frequencies, a series resonant circuit coupled between said first and second electrodes for providing a negligible impedance path for signals having said difference frequencies, and an output circuit coupled between said second and a third of said electrodes.

7. The mixer circuit of claim 6 wherein said two condensers have a common junction and said first electrode is coupled to said junction.

8. In a mixer circuit which includes a semiconductive device having at least three electrodes, and further includes a circuit in which a first signal is produced coupled to a first and second of said electrodes, said mixer circuit also including means coupled to said first and second electrodes for applying a second signal to said device which differs in frequency from said first signal, said circuit in which said first signal is produced presenting a relatively high impedance to said device at frequencies substantially equal to the difference between the respective frequencies of said first and second signals, said mixer circuit further including an output circuit coupled to said second electrode and a third of said electrodes, means for increasing the flow of current in said output circuit at said difference frequency, comprising: resonant means coupled to said first and second electrodes for providing a relatively low impedance path between said electrodes for signals having said difference frequency.

9. A mixer circuit comprising: a semiconductive device having at least three electrodes, a circuit in which signals having selected frequencies are produced coupled to a first and second of said electrodes, means coupled to said first and second electrodes for applying a second signal to said device which differs in frequency from said selected signals, said circuit in which said signals having said selected frequencies are produced being constructed to constitute a relatively high impedance to signals flowing between said first and second electrodes having frequencies substantially equal to the difference between said selected frequencies and the frequency of said second signal, an output circuit coupled to said second electrode and a third of said electrodes, and means including resonant means for providing a relatively low impedance path between said first and second electrodes to signals therein having said difference frequencies.

References Cited in the file of this patent

UNITED STATES PATENTS

| | | |
|---|---|---|
| 2,278,030 | Weber | Mar. 31, 1952 |
| 2,812,433 | Stolk | Nov. 5, 1957 |

OTHER REFERENCES

Automatic Gain Control of Transistor Amplifiers, Chow and Stern, Proceedings of the Institute of Radio Engineers, September 1955, page 1127.

Book: Howard Sams Servicing Transistor Radios, TSM-1, first edition, April 1958, Sams & Co., Indianapolis 5, Indiana, TK 6564.T7S3, page 89 cited, "Pontiac Circuit."

Transistor Circuit Engineering, Shea, 1957, John Wiley & Sons, New York.